United States Patent
Link et al.

(10) Patent No.: US 9,595,939 B2
(45) Date of Patent: Mar. 14, 2017

(54) REACTANCE FILTER HAVING A STEEP EDGE

(75) Inventors: Andreas Link, Munich (DE); Stephan Marksteiner, Neubiburg (DE)

(73) Assignee: EPCOS AG, Munich (DE)

( * ) Notice: Subject to any disclaimer, the term of this patent is extended or adjusted under 35 U.S.C. 154(b) by 978 days.

(21) Appl. No.: 13/254,383

(22) PCT Filed: Mar. 2, 2010

(86) PCT No.: PCT/EP2010/052621
§ 371 (c)(1),
(2), (4) Date: Sep. 1, 2011

(87) PCT Pub. No.: WO2010/100148
PCT Pub. Date: Sep. 10, 2010

(65) Prior Publication Data
US 2011/0316649 A1     Dec. 29, 2011

(30) Foreign Application Priority Data
Mar. 4, 2009 (DE) .......... 10 2009 011 639

(51) Int. Cl.
  H03H 9/54   (2006.01)
  H03H 9/02   (2006.01)
  H03H 9/70   (2006.01)
  H03H 9/56   (2006.01)
  H03H 9/60   (2006.01)

(52) U.S. Cl.
  CPC ........ *H03H 9/542* (2013.01); *H03H 9/02007* (2013.01); *H03H 9/02157* (2013.01); *H03H 9/566* (2013.01); *H03H 9/568* (2013.01); *H03H 9/605* (2013.01); *H03H 9/706* (2013.01)

(58) Field of Classification Search
  CPC ........ H03H 9/706; H03H 9/725; H03H 9/605; H03H 9/566; H03H 9/542; H03H 9/02157; H03H 9/02007; H03H 9/568
  USPC ....... 333/133, 193, 194, 195, 196, 186, 187, 333/188, 189; 310/313 B, 313 D
  See application file for complete search history.

(56) References Cited

U.S. PATENT DOCUMENTS

| | | | |
|---|---|---|---|
| 3,718,874 A * | 2/1973 | Cooper, Jr. .......... | 333/204 |
| 6,653,913 B2 | 11/2003 | Klee et al. | |
| 6,747,530 B1 | 6/2004 | Selmeier | |
| 7,170,370 B2 | 1/2007 | Inoue et al. | |
| 7,195,931 B2 * | 3/2007 | Jarvis et al. .......... | 438/14 |
| 7,616,079 B2 | 11/2009 | Tikka et al. | |
| 8,125,298 B2 | 2/2012 | Hara et al. | |
| 2001/0048352 A1 | 12/2001 | Klee et al. | |

(Continued)

FOREIGN PATENT DOCUMENTS

| DE | 103 30 136 A1 | 11/2004 |
|---|---|---|
| DE | 10 2004 053 319 A1 | 5/2006 |

(Continued)

*Primary Examiner* — Robert Pascal
*Assistant Examiner* — Jorge Salazar, Jr.
(74) *Attorney, Agent, or Firm* — Slater Matsil, LLP

(57) ABSTRACT

A reactance filter includes a series branch that connects a signal input to a signal output. At least one parallel branch branches off from the series branch with respect to ground. A parallel resonator is arranged in each parallel branch. Two or more series resonators are connected in series in the series branch. A capacitor is connected in parallel with one of the series resonators in the series branch.

17 Claims, 4 Drawing Sheets

(56) References Cited

U.S. PATENT DOCUMENTS

| | | | |
|---|---|---|---|
| 2004/0046622 A1 | 3/2004 | Aigner et al. | |
| 2004/0130410 A1 | 7/2004 | Nishimura et al. | |
| 2004/0212452 A1* | 10/2004 | Tsutsumi et al. | 333/133 |
| 2004/0227587 A1 | 11/2004 | Inoue et al. | |
| 2004/0263286 A1 | 12/2004 | Unterberger | |
| 2005/0035828 A1 | 2/2005 | Kyoung et al. | |
| 2005/0212612 A1 | 9/2005 | Kawakubo et al. | |
| 2006/0164183 A1 | 7/2006 | Tikka et al. | |
| 2008/0136555 A1 | 6/2008 | Schmidhammer | |
| 2009/0002095 A1* | 1/2009 | Terada et al. | 333/133 |

FOREIGN PATENT DOCUMENTS

| | | | |
|---|---|---|---|
| EP | 1 478 091 A2 | 11/2004 | |
| EP | 1 196 991 B1 | 6/2005 | |
| EP | 1 317 797 B1 | 11/2006 | |
| EP | 1 407 546 B1 | 7/2010 | |
| JP | 09-167937 A | 6/1997 | |
| JP | 2001-044790 A | 2/2001 | |
| JP | 2003-179518 A | 6/2003 | |
| JP | 2003-530705 A | 10/2003 | |
| JP | 2004-343168 A | 12/2004 | |
| JP | 2006-013839 A | 1/2006 | |
| JP | 2006-502634 A | 1/2006 | |
| JP | 2006-129445 A | 5/2006 | |
| JP | 2007-181147 A | 7/2007 | |
| JP | 2007-281757 A | 10/2007 | |
| JP | 2008-048040 A | 2/2008 | |
| JP | WO 2009025055 A1 * | 2/2009 | H03H 9/0571 |
| WO | WO 01/78230 A1 | 10/2001 | |
| WO | WO 2004/034579 A1 | 4/2004 | |
| WO | 2009025055 A1 | 2/2009 | |
| WO | WO 2009/023100 A2 | 2/2009 | |

* cited by examiner

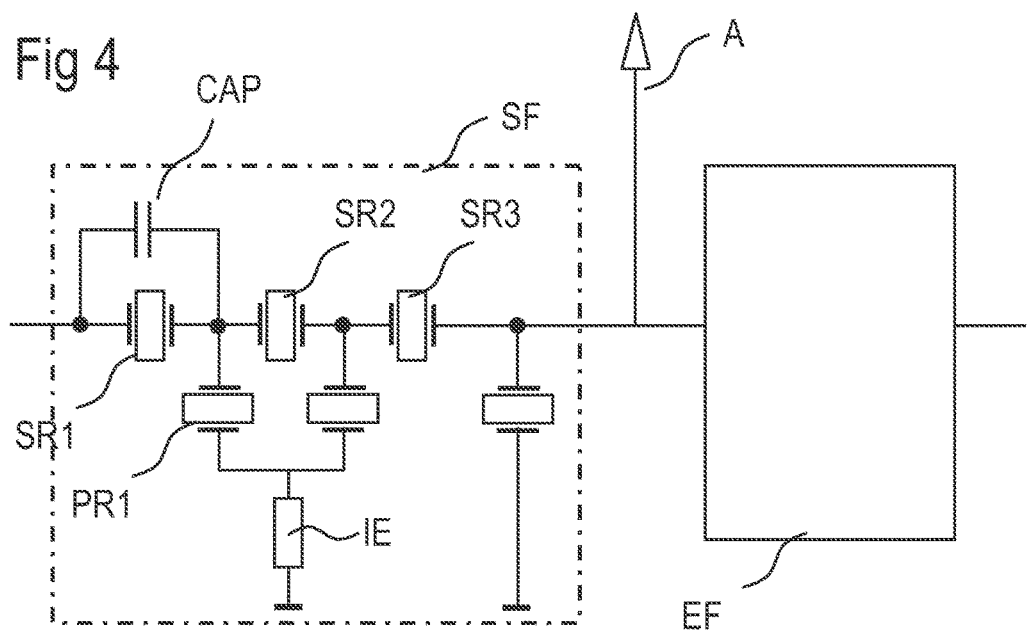
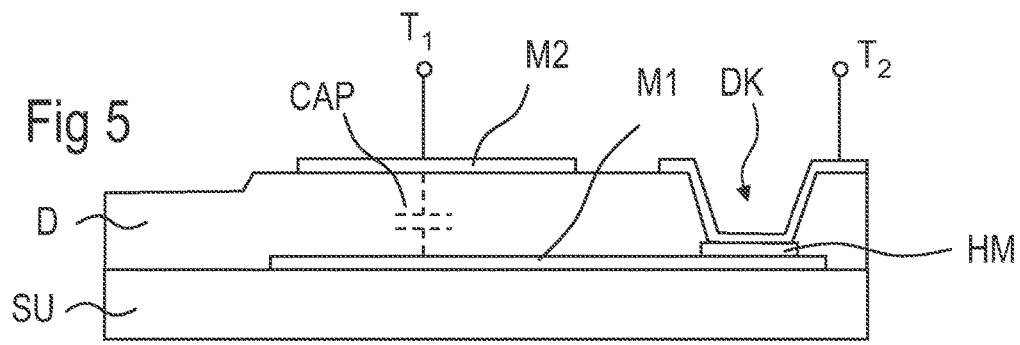
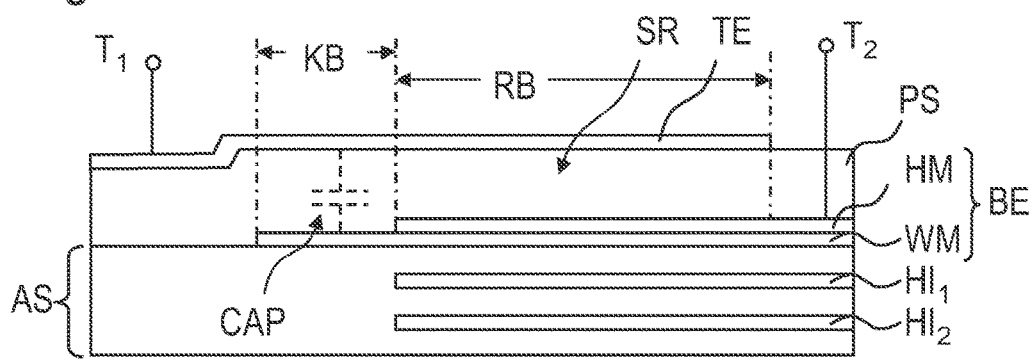

REACTANCE FILTER HAVING A STEEP EDGE

This patent application is a national phase filing under section 371 of PCT/EP2010/052621, filed Mar. 2, 2010, which claims the priority of German patent application 10 2009 011 639.7, filed Mar. 4, 2009, each of which is incorporated herein by reference in its entirety.

BACKGROUND

Reactance filters having a bandpass filter character can be constructed from a ladder/lattice-like interconnection of impedance elements and, in particular, of resonators to form so-called ladder-type or lattice arrangements. The document EP 1 196 991 A1 discloses a ladder-type filter, for example, which is constructed from acoustic single-port resonators using SAW technology (SAW=Surface Acoustic Wave). The advantage of such a reactance filter is that, by means of the number and type of the elements used, it is possible to set the filter properties and, in particular to improve the stop band suppression.

A reactance filter of ladder-type arrangement constructed from BAW resonators (BAW=Bulk Acoustic Wave) is known from document EP 1 407 546 A1, for example. In this case, BAW technology affords the advantage that it is possible to obtain frequency-accurate and power-resistant bandpass filters having a relatively low temperature response of the resonant frequency. On account of the frequency accuracy of BAW filters, the latter also finds a principal use in duplexers.

A further essential advantage of BAW technology is the high quality factors of greater than 1000 that can be achieved with BAW resonators. That allows very steep filter edges in the case of BAW reactance filters. Thus, the low temperature response and the high frequency accuracy predestine BAW filters for duplexer applications with a small separation between transmission and reception bands.

A duplexer comprises a transmission filter and a reception filter, which are usually constructed on separate substrates. Between transmission and reception bands there is often only a small band gap, which, in the case of the PCS mobile radio system used in the USA, for example, is only 20 megahertz at a center frequency of 1.9 gigahertz. Filters with G band extension even require duplexers whose band gap is reduced further to 15 megahertz. Such a small gap between transmission and reception bands of less than one percent relative width requires, besides a resonator technology having high quality factors and good temperature stability, also a filter design which enables steep filter edges for the two filters combined in the duplexer. It is particularly important that those two edges of the two passbands which face one another in terms of frequency are configured in a steep fashion in order to obtain the best possible demarcation between the two passbands. For the abovementioned G band duplexers, the necessary edge steepness taking account of manufacturing variations and temperature-dependent fluctuations is at least 5 dB/MHz. However, even steeper edges are desirable since this can increase both the specification of the filters or duplexers and the manufacturing yield in the case of a manufacturing-dictated fluctuation.

EP 1 407 546 A1, already cited, proposes steepening an edge of the passband by reducing the ratio of static and dynamic capacitance in a resonator. The antiresonant frequency of the resonator is thus increased in a targeted manner, without the resonant frequency of this resonator being changed simultaneously in this case. As a result, the coupling decreases and the passband edge assigned to the resonator becomes steeper. For the purpose of realization, it is proposed to use piezomaterials or electrode materials having lower coupling. As a further measure it is proposed to use acoustic mirrors that can likewise lower the acoustic coupling of the respective resonator.

A further possibility for configuring an edge in a steeper fashion consists in using in the reactance filter more parallel resonators that generate more pronounced or additional zeroes and therefore also steepen the edge. What is disadvantageous however, is that with this method the ohmic losses of the reactance filter also increase as a result of the number of interconnected series resonators. Furthermore, the parallel-connected resonators in the reactance filter can be connected in series with inductances, wherein zeroes can be shifted to lower frequencies. This brings about not only an increase in the isolation, but also a higher bandwidth of the bandpass filter. A steeper right-hand edge of the passband is achieved by means of an increased number of series resonators, the antiresonance of which influences the position of the edge and hence the steepness thereof.

What is disadvantageous about the known solutions for improving the edge steepness is, generally, that they either bring about higher losses or can be produced only with increased interconnection and production outlay. A further disadvantage here is that for more resonators on the chip, a larger chip area is also necessary. If two series resonators are added, implicitly at least one more parallel resonator is also required, such that a total of three additional resonators are present.

SUMMARY OF THE INVENTION

In one aspect, the present invention specifies a reactance filter with which, in a targeted manner, the right-hand edge of the passband can be configured in a steeper fashion.

A reactance filter of ladder-type or lattice arrangement known per se is proposed which comprises at least one series branch, which connects a signal input to a signal output. The reactance filter additionally has at least one parallel branch which, in the case of a ladder-type filter, branches off from the series branch with respect to ground or, in a lattice arrangement, interconnects the two series branches present here. A parallel resonator is arranged in each parallel branch and a plurality of series resonators are connected in series in each series branch in this reactance filter arrangement that is known to this extent. According to the invention, a capacitor is now connected in parallel with at least one of the series resonators. This parallel capacitor increases the effective static capacitance $C_0$ of the series resonator and thereby changes the ratio of dynamic to static capacitance of the resonator. While the resonant frequency of the series resonator according to the formula:

$$f_r = \frac{1}{2\pi\sqrt{C_1 L}}$$

is dependent exclusively on the dynamic capacitance Cl and the inductance of the resonator, the antiresonant frequency $f_a$ according to the formula:

$$f_a = f_r\sqrt{1 + \frac{C_1}{C_0}}$$

additionally has a dependence on the ratio of dynamic to static capacitance. With the static capacitance increased according to the invention, the antiresonant frequency $f_a$ is also reduced, without the position of the resonant frequency simultaneously changing in this case. The coupling of the resonator is thus reduced.

Since the antiresonant frequency $f_a$ of the series resonators directly determines the position of the right-hand filter pole ("notch"), this reduced coupling brings about a shift in the pole toward the left to lower frequencies, even if the reduction of the coupling is performed at only one series resonator, or in any case not at all of the series resonators. The width of the passband remains virtually unchanged, since at least one of the series resonators but not all of the series resonators have a capacitor connected in parallel. As a result, the steepness of the right-hand passband edge is effectively increased, without appreciable losses in the bandwidth having to be accepted. The reactance filter arrangement specified makes it possible to increase the edge steepness by 1 dB/MHz, for example.

The capacitor in parallel with a series resonator can be embodied using any desired technology. It can be connected up as an external capacitor with the resonators.

It is advantageous, however, to produce the capacitor in a manner integrated with the reactance filter and, for this purpose, to use common manufacturing steps, in particular. It is therefore advantageous to produce the capacitor in parallel with the resonator or resonators.

A reactance filter constructed from SAW single-port resonators has transducers having a capacitance. An additionally produced transducer having a changed electrode finger spacing can therefore be utilized as a capacitor in filters composed of SAW single-port resonators.

For the reasons already mentioned, it is particularly advantageous to form a reactance filter from BAW resonators. The latter have a structured layer construction above a substrate. The layer construction comprises at least one bottom electrode, a piezoelectric layer and a top electrode. In this case, a capacitor produced in a manner integrated with the resonator utilizes at least one of the electrode layers as a capacitor electrode. The capacitor has, for example, a layer sequence metal 1/dielectric/metal 2, which, in principle, can be realized with the layer construction bottom electrode/piezoelectric layer/top electrode. However, in order that such a capacitor is not likewise active as a resonator, further measures are required here, however, in order to shift the resonant frequency of the capacitor into a range that lies outside the passband of the reactance filter.

A further possibility for producing the capacitor in parallel with the structural units of the series resonator consists in using a series resonator with an acoustic minor arranged between substrate and series resonator. The acoustic minor comprises a high-impedance layer formed from metal. The layer can be used as an electrode layer in the layer sequence for the capacitor construction.

One simple possibility for the parallel structuring of the layer construction for the resonators and the layer sequence for the capacitor consists in realizing the capacitor and the resonators laterally alongside one another in the layer construction. In particular, for this purpose a resonator region can be arranged laterally alongside a capacitor region. In the resonator region, the layers and layer thicknesses are set such that they yield the corresponding resonant frequency. In the capacitor region arranged laterally with respect thereto, by contrast, the layer sequence for the capacitor is configured, e.g., with regard to the layer thicknesses such that the resonant frequency of the capacitor lies outside the passband of the reactance filter. However, it is also possible to omit individual layers of the resonator region in the capacitor region or to apply other layers exclusively in the capacitor region, e.g., at the top onto the top electrode, and thus to shift the resonant frequency of this capacitor into a non-critical range.

One possibility for changing the layer sequence such that the resonant frequency shifts in the capacitor region consists in changing the layer thickness of the bottom electrode in the capacitor region. Usually, the bottom electrode comprises a layer of a hard metal and a layer of a soft metal. By means of an additional structuring step, in the capacitor region, it is then possible to remove one of these two layers, usually the upper partial layer of the bottom electrode, which can be formed, e.g., by the hard metal.

In accordance with a further embodiment, the top electrode of the resonator and an electrically conductive layer of the acoustic mirror in the capacitor region are used as metal 1 and metal 2 in the layer sequence for the capacitor. For this purpose, the bottom electrode is completely removed in the capacitor region, such that the capacitor is formed between the top electrode and the mirror layer.

However, it is also possible to form the capacitor between the bottom electrode and a high-impedance layer of the acoustic mirror. This has the advantage that the capacitor can be formed for the most part or wholly below the resonator, without requiring additional area on the substrate. Such a capacitor can therefore be produced in a particularly simple manner and does not increase the basic area of the component, or increases it only to an insignificant extent.

In the reactance filter, the capacitor is connected in parallel with at least one series resonator. For this purpose, it is necessary to connect the capacitor electrodes to the corresponding resonator electrodes. In the case of the capacitor formed between bottom electrode and high-impedance layer in the acoustic mirror, for this purpose the top electrode is electrically conductively connected to the high impedance by means of a plated-through hole. The plated-through hole is preferably arranged outside the resonator region.

All other arrangements in which capacitor region and resonator region at least partly overlap are also advantageous.

In one preferred embodiment, a capacitor is connected in parallel with the series resonator that lies closest to the signal input. At least one of the remaining series resonators is formed without a resonator connected in parallel. A parallel-connected capacitance at the signal input can facilitate the matching at the input in many configurations. By way of example, a smaller series inductance is then needed in order to match the port to 50 ohms.

In the case of a reactance filter according to the invention, a maximum effect with regard to a steeper upper edge is obtained if the capacitance of the capacitor is in the range of between 1% and 50%, and preferably in the range of 3%-30%, of the static capacitance of the resonator.

BRIEF DESCRIPTION OF THE DRAWINGS

The invention is explained in greater detail below on the basis of exemplary embodiments and the associated figures. The figures serve solely for better understanding of the invention and have therefore been drawn up only schematically and not in a manner true to scale. Likewise, individual parts may be illustrated with their size changed, and so relative size relationships cannot be inferred from the figures either.

FIG. 4 shows a duplexer comprising a reactance filter according to the invention;

FIG. 5 shows a capacitor realized from the layer construction of the reactance filter;

FIG. 6 shows a series resonator with adjacent capacitor, wherein both the acoustic minor and the hard part of the bottom electrode have been removed;

The following list of reference symbols may be used in conjunction with the drawings:
A Antenna
AS Acoustic mirror
BE Bottom electrode of the series resonator
CAP Capacitor
CH Chip
D Dielectric
DK Plated-through hole
EF Reception filter
HI High-impedance layer of the acoustic mirror, electrically conductive
HM Hard metal layer of the bottom electrode
IE Impedance element
K1, K2 Transmission curves
KB Capacitor region
NI Low-impedance layer
PR Parallel resonator
PS Piezoelectric layer
PZ Parallel branch
RB Resonator region
SA Signal output
SAB Layer construction for resonator (and capacitor)
SE Signal input
SF Transmission filter
SR Series resonator
SU Substrate
SZ Series branch
T1, T2 Connections
TE Top electrode of the series resonator
WM Soft metal layer of the bottom electrode

DETAILED DESCRIPTION OF ILLUSTRATIVE EMBODIMENTS

Figure 1:
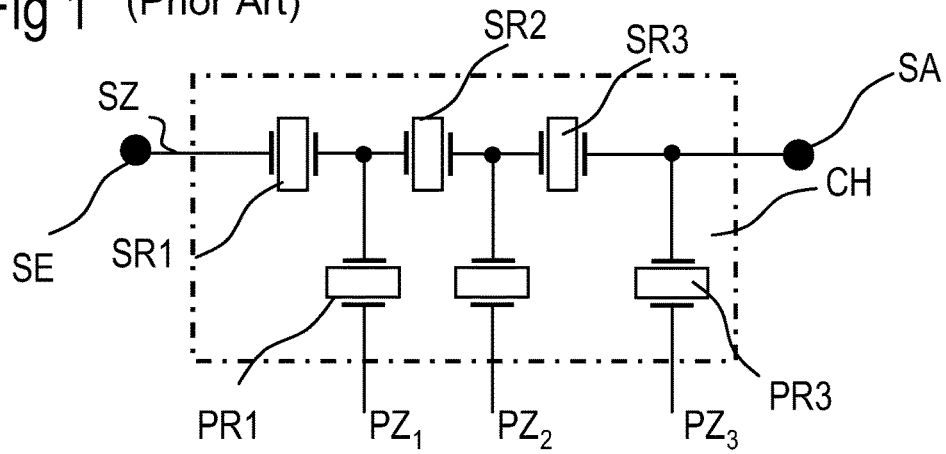
FIG. 1 shows a reactance filter known per se, which is constructed from resonators.

FIG. 1 shows a reactance filter having a ladder-type construction as known from the prior art. The filter is formed from resonators on a chip CH as carrier. A series branch SZ is connected between a signal input SE and a signal output SA. Proceeding from nodes of the series branch, here three parallel branches PZ are connected with respect to a fixed potential and, in particular, with respect to ground. A parallel resonator PR is arranged in each of the parallel branches PZ. The series branch SZ comprises a series interconnection of series resonators SR.

Figure 2:
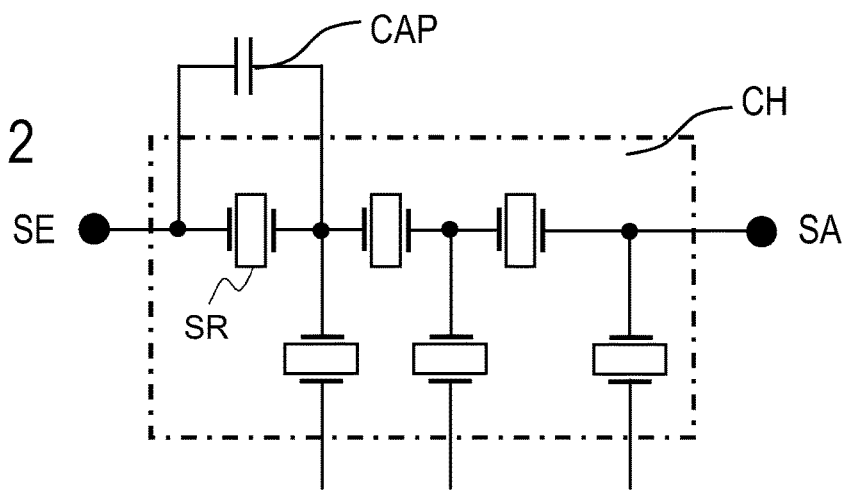
FIG. 2 shows a reactance filter according to the invention with an external capacitance.

FIG. 2 shows a reactance filter, wherein a capacitor CAP is connected in parallel with a series resonator SR. Advantages are already obtained if a single one of the series resonators SR is connected in parallel with a capacitor, although such a capacitor can also bridge a plurality of series resonators in parallel (not illustrated in the figure). At least one of the series resonators remains unchanged relative thereto.

The resonators SR, PR can be manufactured using any desired technology, since the mode of operation of the capacitor connected in parallel with the series branch is an electrical mode of operation and can therefore be employed for all known resonators. The capacitor CAP is, as illustrated in FIG. 2, an external capacitor, for example, which can be connected up as an SMD component or external circuit element manufactured using a different technology with the reactance filter. Reactance filter and capacitor can be arranged on a common circuit board, for example. It is also possible to mount a discrete capacitor on the chip of the reactance filter. Instead of using an SMD capacitor, the capacitance can also be integrated in a multilayered circuit board.

All the series resonators SR and parallel resonators PR of the reactance filter can be arranged on a common substrate, which is embodied as a chip CH, for example. Owing to the different frequencies of series resonators and parallel resonators, however, it can also be advantageous to realize series resonators and parallel resonators on different substrates or chips.

Figure 3:
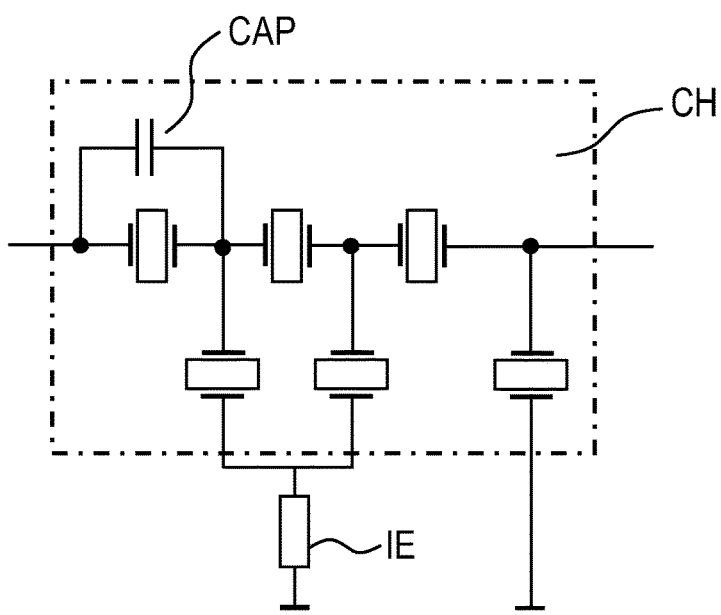
FIG. 3 shows a reactance filter according to the invention with an internal capacitance.

FIG. 3 shows a reactance filter, wherein the capacitor CAP is integrated on the chip CH of the reactance filter. It is additionally indicated that two of the parallel branches can be connected on or outside the chip to form a common branch and can be connected to ground by means of an impedance element IE, in particular an inductance. In this way it is possible to shift the poles of the reactance filter that are produced with the parallel resonators.

FIG. 4 shows an advantageous application for a reactance filter according to the invention. On account of its steep upper edge, this reactance filter can be used, in particular, in a duplexer for forming the transmission filter SF. The upper edge of the passband of the transmission filter faces toward the lower edge of the passband of the reception filter EF, such that the two filters of the duplexer are better isolated from one another by the steeper upper edge of the passband of the transmission filter SF. Both filters are connected to the antenna A. The illustration does not show a matching network, for example, a quarter-wave transmission line, which prevents, for example, the transmission signal from the signal output of the transmission filter SF from coupling into the reception filter EF.

FIG. 5 shows how a layer construction that is typically utilized for producing BAW resonators can be manufactured according to the invention and in a simple manner also for producing the capacitor by means of process steps which are also used for producing BAW resonators. It is therefore possible, in the case of BAW resonators, to integrate the production of the capacitor CAP into the process for manufacturing the BAW resonators in a simple manner.

Such a layer construction comprises, for example, a substrate SU, a first metal layer M1, which constitutes the bottom electrode of the BAW resonators, a dielectric D, which can be the piezoelectric layer in the layer construction of the BAW resonators, and also a second metal layer M2, for which the top electrode can be used.

The capacitor CAP formed from the layer sequence first metal M1/dielectric D/second metal M2 is connected by corresponding connections $T_1$, $T_2$. The first metal layer bearing, e.g., directly on the substrate or on an insulation layer applied thereabove can be connected via a plated-through hole DK through the dielectric D. For better connection to the electrode material, in the region of the plated-through hole DK, a further metal can be applied locally on the first metal layer M1, here in particular a hard metal layer HM. The plated-through hole DK makes it possible to provide both connections of the capacitor CAP on the surface of the layer construction, where they can be connected particularly simply or can be connected to an external circuit environment.

The capacitor illustrated in FIG. 5 can be realized at any desired location on the substrate of a BAW resonator or on the substrate of a reactance filter constructed from BAW resonators. In the form illustrated, the capacitor CAP can be realized away from the resonator region.

It is advantageous, however, to form the capacitor CAP in a manner directly adjacent to a resonator and, in particular, adjacent to the series resonator SR connected to it. FIG. 6 shows a possibility for distinguishing by virtue of the corresponding structuring of the bottom electrode BE between the region of the series resonator SR (resonator region) and the region of the capacitor CAP (capacitor region).

The bottom electrode comprises two metal layers, namely a lower soft metal layer WM and a hard metal layer HM arranged thereabove. By removing the hard metal layer HM in the capacitor region KB it is possible to form the latter with different resonance properties than the resonator region RB, such that a different resonant frequency than in the series resonator is obtained in the capacitor. Therefore, the capacitor CAP acts in the region of the center frequency of the reactance filter exclusively by way of its capacitance and therefore does not act as a resonator, since its resonant frequency lies outside the frequencies that are crucial for the passband of the reactance filter. In the case of this construction, the soft metal layer WM, which is part of the bottom electrode BE, can be used as first metal layer M1 of the capacitor and the top electrode TE can be used as second metal layer M2 of the capacitor. The piezoelectric layer PS of the series resonator or of the BAW layer construction acts as a dielectric in the capacitor region KB.

Of course, it is also possible using other means to avoid in the capacitor region KB a resonance that lies in the range of the passband of the reactance filter. Thus, in particular, the layer thickness of the dielectric D of the piezoelectric layer PS can be changed, and in particular reduced, in the capacitor region KB.

The figure additionally illustrates an acoustic mirror AS arranged below the bottom electrode BE. The acoustic minor AS alternately comprises low- and high-impedance layers HI (e.g., HI1 and HI2) manufactured from corresponding materials having a high and a low acoustic impedance. In particular, the high-impedance layers HI consist of a heavy metal and are therefore electrically conductive. The intervening low-impedance layer used is usually a dielectric, and in particular an oxide. The partial layers of the acoustic minor AS can be quarter-wave layers having a given wavelength, such that, at the interfaces between the partial layers, acoustic waves in the range of said wavelength can be reflected back into the resonator.

FIG. 6 illustrates that the acoustic mirror AS extends only over the resonator region RB, or that is to say that the high-impedance layers HI are cut out in the capacitor region KB. For this embodiment, however it is also possible for the acoustic minor to be arranged over the whole area and thus also in the capacitor region.

Figure 7A:
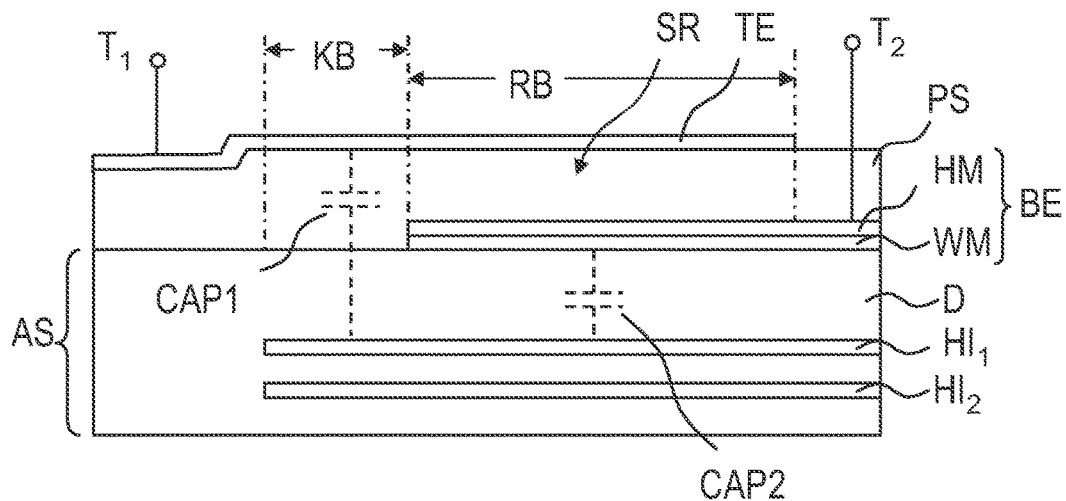
FIGS. 7A and 7B show, in schematic cross section and in an equivalent circuit diagram, a series resonator with a directly connected capacitor, which is formed between the top electrode of a high-impedance layer and the bottom electrode.
Figure 7B:
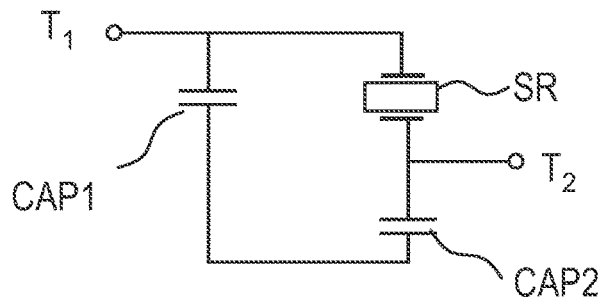

FIG. 7A shows one possibility for forming the capacitor region between the top electrode TE and one of the high-impedance layers HI of the acoustic mirror AS. For this purpose, the bottom electrode is removed in the capacitor region KB, such that top electrode and high-impedance layer HI1 are separated only by the piezoelectric layer PS and the dielectric D of the acoustic mirror AS. This embodiment has the advantage that a further capacitor CAP2 is formed between the high-impedance layer HI1 and the bottom electrode BE, the further capacitor being connected in series with the first capacitor CAP1 in the capacitor region KB. In this way, a direct contact-connection of the high-impedance layer HI1 can be obviated, since the high-impedance layer HI1 constitutes a floating electrode in the series connection of the two capacitors CAP1 and CAP2. FIG. 7B shows the equivalent circuit diagram of the arrangement shown in cross section in FIG. 7A, which once again constitutes only a part of a reactance filter according to the invention such as is illustrated, e.g., in one of FIGS. 2 to 4.

Figure 8A:
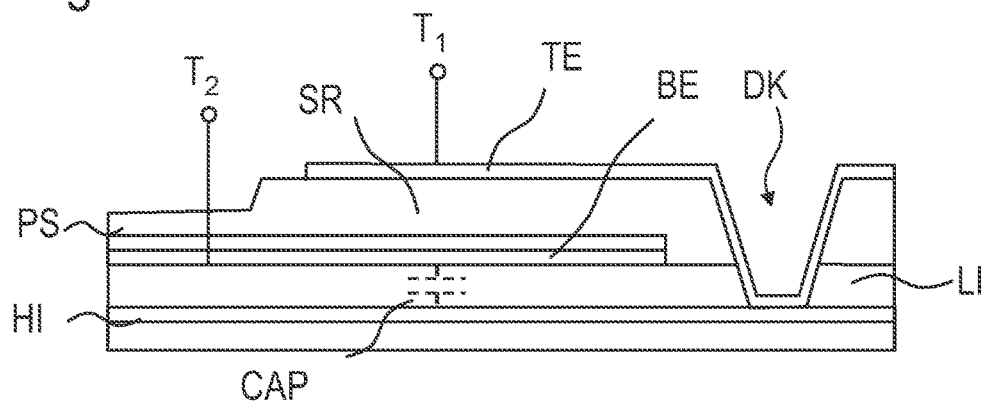
FIGS. 8A and 8B show an arrangement composed of a series resonator and a capacitor formed between the bottom electrode and a high-impedance layer, in schematic cross section and in a block diagram.

FIG. 8A shows a further possibility for realizing the capacitor in the layer construction of a BAW resonator. In the variant illustrated from FIG. 8A, the capacitor CAP is formed between the high-impedance layer HI of the acoustic mirror and the bottom electrode BE of the series resonator SR. In this case, the capacitor is arranged directly below the series resonator and requires no additional area. At one location, merely a plated-through hole DK for the electrical connection of the high-impedance layer HI is implemented in order thereby to make electrical contact with the second electrode of the capacitor. This embodiment is particularly space-saving and requires only little structuring outlay for production purposes. In the plated-through hole DK, the top electrode is electrically conductively connected to the high-impedance layer HI.

Figure 8B:
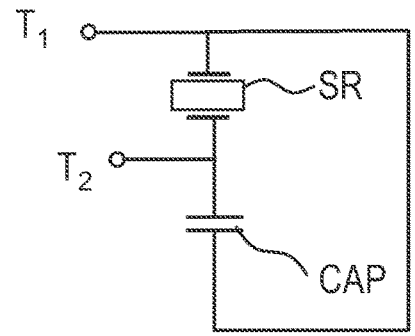

FIG. 8B shows the equivalent circuit diagram of the arrangement, which once again forms a partial excerpt from a block diagram of a reactance filter according to the invention such as is illustrated, e.g., in one of FIGS. 2 to 4.

The desired effect of the steepening of the right-hand edge is achieved with each additional capacitance value which, as a result of connection in parallel with the series resonator, increases the static capacitance thereof. A good effect and a sufficient steepening of the upper passband edge of the reactance filter are achieved with a capacitor whose capacitance lies in the range of 3%-30% of the static capacitance of the series resonator.

Figure 9:
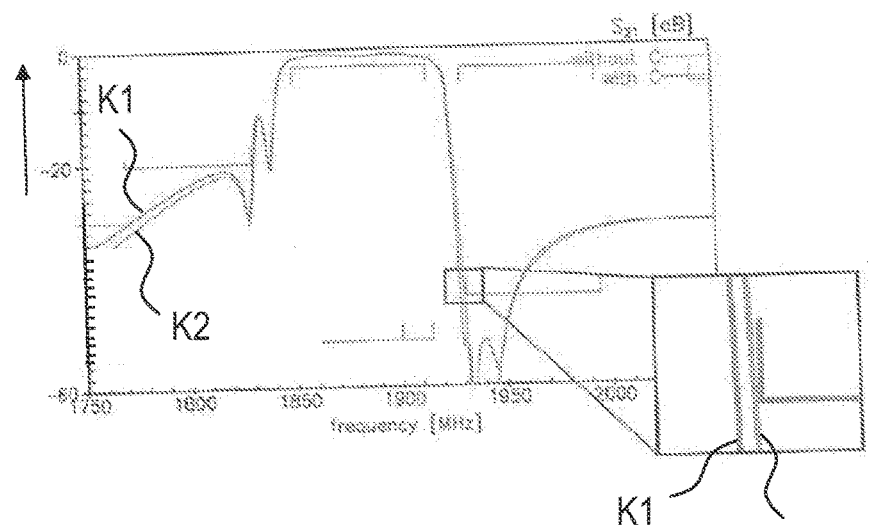
FIG. 9 shows the transmission curves of a reactance filter according to the invention in comparison with a known reactance filter otherwise constructed in the same way.

In FIG. 9, the simulated transmission curve K1 (S21) of a reactance filter embodied according to the invention in accordance with FIG. 3 is compared with the simulated transmission curve K2 with a known reactance filter embodied in accordance with FIG. 1. The capacitor of the reactance filter according to the invention has a capacitance of 0.32 pF, while the static capacitance of the series resonator is approximately 1.2 pF. It is found that the right-hand edge of the passband is steepened by approximately 0.7 dB/MHz in the case of the reactance filter according to the invention. The gradient of the curve K1 is 4.7 dB/MHz, and the gradient of the curve K2 of the known filter is 4.0 dB/MHz. In the remaining range of the passband, both curves are virtually congruent. That shows that other filter properties are not affected, or are affected only to an insignificant extent, by the additional capacitance CAP connected in parallel with the series resonator.

An excerpt from the lower part of the roll-off edge for both curves K1, K2 is illustrated in an enlarged manner at the bottom right in the figure. The steeper curve K1 of the reactance filter according to the invention reaches a predetermined isolation level earlier, such that the passband is demarcated to a greater extent relative to adjacent frequencies. Accordingly, it is particularly advantageous if the filter is used as a transmission filter in a duplexer with a higher reception band, in particular in a duplexer with a small band gap, as is the case, for example, for the PCS band used in the USA.

Figure 10:
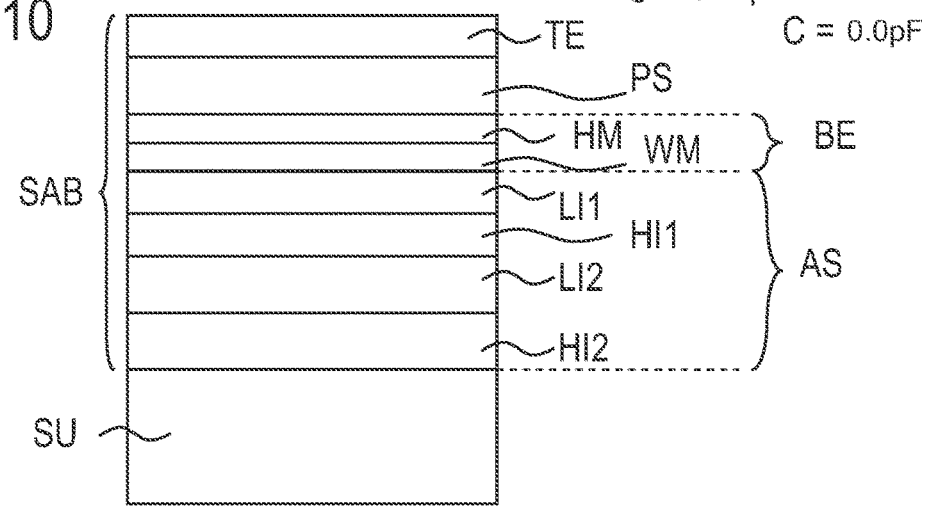
FIG. 10 shows an exemplary layer construction for a BAW resonator whose partial layers can be used for realizing resonator and capacitor.

FIG. 10 shows schematically again a possible complete layer construction SAB such as can be used in the production of BAW resonators. A crystalline material, in particular a silicon wafer, usually serves as a substrate SU. In the construction variant as an SMR resonator (SMR=Surface Mounted Resonator), an acoustic minor AS is constructed directly above the substrate SU, the acoustic minor comprising an alternating succession of high-impedance layers HI and low-impedance layers LI. A sufficiently functional acoustic minor AS is obtained with two pairs of high-impedance and low-impedance layers. In particular, heavy metal such as tungsten, platinum or molybdenum are used as high-impedance layers, while the low-impedance layers, in a manner governed by production, can usually be an oxide used in semiconductor technology, in particular silicon oxide.

The bottom electrode BE is arranged above the acoustic mirror. The bottom electrode can be multilayered and have, in particular, a soft metal layer WM and a hard metal layer HM thereabove. By way of example, aluminum is suitable as a soft metal, whereas molybdenum and tungsten are again suitable as a hard metal HM.

The piezoelectric layer PS is arranged above the bottom electrode BE. The piezoelectric layer is usually constructed homogeneously and advantageously from a piezoelectric material such as aluminum nitride, zinc oxide or similar materials.

The top electrode TE, which can be single- or multilayered, is applied above the piezoelectric layer PS. In the simplest variant, the top electrode TE is an aluminum layer. However, like the bottom electrode, it can likewise be formed from a heavy metal.

Within this possible layer construction SAB for the BAW resonators, it is now possible to utilize two arbitrary electrically conductive layers for the construction of the capacitor CAP used according to the invention. Two electrically conductive layers which are at only a small distance from one another in the layer construction SAB are advantageously used.

The setting of the capacitance of the capacitor CAP is accomplished by means of corresponding structuring of one of the two electrically conductive layers used for the capacitor (electrode or minor layers). If partial layers of the resonator such as top electrode, piezoelectric layer and bottom electrode are used for the capacitor CAP, and this layer construction is varied in the capacitor region KB with regard to at least one of the layers in order to correspondingly shift the resonant frequency. This can also be the top electrode TE.

The reactance filter according to the invention is not restricted to the exemplary embodiments illustrated. The invention is technology-independent, but is advantageously realized with BAW resonators and a capacitor integrated into the layer construction of the BAW resonators.

A filter according to the invention can differ from the illustrated reactance filters with regard to the number of series resonators, parallel resonators and capacitors connected in parallel. In addition, the reactance filter can be connected up with further impedance elements, in particular with inductances or capacitances. Parts of the resonators of a reactance filter according to the invention can be replaced by other impedance elements. In the interconnection, individual elements such as resonators can also be replaced by a series or parallel interconnection of two or more elements of the same type, without the properties of the filter being impaired as a result.

Furthermore, the reactance filter can also be constructed on membrane-based BAW resonators. In this case, there is no acoustic mirror, but the frequency shift of the capacitor region can be realized as described above by the etching or thinning of the hard bottom electrode layer. As an alternative thereto, in the capacitor region, it is also possible to deposit an additional layer on the top electrode.

The invention claimed is:

1. A reactance filter comprising:
   a series branch, which connects a signal input to a signal output;
   at least one parallel branch that branches off from the series branch with respect to ground, wherein a parallel resonator is arranged in each of the at least one parallel branch;
   two or more series resonators connected in series in the series branch, wherein the two or more series resonators and the parallel resonator(s) of the at least one parallel branch comprise BAW resonators and are realized as a structured layer construction on a substrate;
   a capacitor connected in parallel with one of the two or more series resonators in the series branch;
   an insulation layer arranged between the capacitor and the substrate, wherein the capacitor comprises a metal 1/dielectric/metal 2 layer sequence, wherein a partial area of an electrode layer of one of the two or more series resonators connected in parallel with the capacitor comprises a bottom electrode and a top electrode of the one series resonator, wherein one of the electrode layers is the metal 2 layer; and
   an acoustic mirror arranged on the substrate,
   wherein the one series resonator connected in parallel with the capacitor is located over the acoustic mirror,
   wherein the acoustic mirror comprises a high-impedance layer comprising a metal, and
   wherein the high-impedance layer is the metal 1 layer in the layer sequence of the capacitor.

2. The reactance filter according to claim 1, wherein the capacitor and the two or more series resonators in the series branch and the parallel resonator(s) in the at least one parallel branch, are located next to each other in the structured layer construction.

3. The reactance filter according to claim 1,
   wherein the structured layer construction comprises the acoustic mirror below the bottom electrode of the one series resonator in a resonator region that includes the one or more of the series resonators in the series branch and the parallel resonator(s) in the at least one parallel branch, and
   wherein no bottom electrode of the one series resonator is located in a capacitor region, such that the capacitor is formed between the metal 2 layer comprising the top electrode of the one series resonator and the metal 1 layer comprising the high-impedance layer.

4. The reactance filter according to claim 1,
wherein the structured layer construction comprises the acoustic mirror below the bottom electrode of the one series resonator in a resonator region that includes one or more of the series and parallel resonators, and
wherein the capacitor is formed between the metal 2 layer comprising the bottom electrode of the one series resonator and the metal 1 layer comprising the high-impedance layer.

5. The reactance filter according to claim 4, wherein the top electrode of the one series resonator and the high-impedance layer are electrically conductively connected via a plated-through hole arranged outside the resonator region.

6. The reactance filter according to claim 4, wherein the structured layer construction is divided into the resonator region and a capacitor region arranged laterally thereto, and wherein the capacitor region and the resonator region at least partly overlap.

7. The reactance filter according to claim 1,
wherein the capacitor is connected in parallel with the one series resonator of the two or more series resonators situated closest to the signal input, and
wherein at least one remaining series resonator of the two or more series resonators does not have the capacitor connected in parallel.

8. The reactance filter according to claim 1, wherein the capacitor has a capacitance of between 1% and 50% of a static capacitance of the associated series resonator.

9. The reactance filter according to claim 1, wherein the capacitor has a resonant frequency that is shifted relative to a resonant frequency of the one series resonator by a layer applied to a top electrode of the capacitor.

10. The reactance filter according to claim 1, wherein the capacitor has a resonant frequency that is shifted relative to a resonant frequency of the one series resonator by virtue of the fact that the capacitor has one layer fewer than the one series resonator.

11. A method comprising:
providing the reactance filter according to claim 1; and applying a signal to the signal input.

12. The method according to claim 11, wherein the reactance filter operates as a transmission filter in a duplexer for a CDMA or a WCDMA mobile radio system.

13. The method according to claim 12, wherein the duplexer comprises the reactance filter as the transmission filter and a further filter which operates as a reception filter, wherein the transmission filter and reception filter are formed on separate substrates.

14. The method according to claim 11, wherein the reactance filter operates as a transmission filter in a duplexer for a PCS mobile radio system.

15. The method according to claim 14, wherein the duplexer comprises the reactance filter as a transmission filter and a further filter as a reception filter, wherein the transmission filter and reception filter are formed on separate substrates.

16. A reactance filter comprising:
a series branch, which connects a signal input to a signal output;
at least one parallel branch that branches off from the series branch with respect to ground, wherein a parallel resonator is arranged in each of the at least one parallel branch;
two or more series resonators connected in series in the series branch; and
a capacitor connected in parallel with one of the two or more series resonators in the series branch, wherein the capacitor has a capacitance of between 1% and 50% of a static capacitance of the associated series resonator.

17. A reactance filter comprising:
a series branch, which connects a signal input to a signal output;
at least one parallel branch that branches off from the series branch with respect to ground, wherein a parallel resonator is arranged in each of the at least one parallel branch;
two or more series resonators connected in series in the series branch, wherein the two or more series resonators and the parallel resonator(s) of the at least one parallel branch comprise BAW resonators and are realized as a structured layer construction on a substrate;
a capacitor connected in parallel with one of the two or more series resonators in the series branch;
an insulation layer arranged between the capacitor and the substrate, wherein the capacitor comprises a metal 1/dielectric/metal 2 layer sequence, wherein a partial area of an electrode layer of the one series resonator connected in parallel with the capacitor is the metal 1 layer or the metal 2 layer; and
an acoustic mirror on the substrate, the one series resonator connected in parallel with the capacitor being located over the acoustic mirror,
wherein the structured layer construction is divided into a resonator region and a capacitor region arranged laterally thereto,
wherein a piezoelectric layer is provided above a bottom electrode and a top electrode is provided above the piezoelectric layer in the resonator region,
wherein the metal 2 layer is the top electrode and the metal 1 layer is the bottom electrode in the capacitor region,
wherein the bottom electrode comprises a layer of a hard metal and a layer of a soft metal, and
wherein one of the two layers of the hard metal or the soft metal is present in the capacitor region, while the other one of the two layers is not present.

* * * * *